US006925583B1

(12) United States Patent
Khu et al.

(10) Patent No.: US 6,925,583 B1
(45) Date of Patent: Aug. 2, 2005

(54) STRUCTURE AND METHOD FOR WRITING FROM A JTAG DEVICE WITH MICROCONTROLLER TO A NON-JTAG DEVICE

(75) Inventors: Arthur H. Khu, San Mateo, CA (US); Conrad A. Theron, San Jose, CA (US); Farshid Shokouhi, San Jose, CA (US); Pushpasheel Tawade, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 376 days.

(21) Appl. No.: 10/043,637

(22) Filed: Jan. 9, 2002

(51) Int. Cl.⁷ .............................................. G06F 11/00
(52) U.S. Cl. ...................................................... 714/30
(58) Field of Search ........................... 714/30, 724–726, 714/734; 716/4; 710/5, 300

(56) References Cited

U.S. PATENT DOCUMENTS

| | | | | |
|---|---|---|---|---|
| 5,689,516 A | * | 11/1997 | Mack et al. | 714/725 |
| 5,706,297 A | * | 1/1998 | Jeppesen et al. | 714/30 |
| 5,708,773 A | * | 1/1998 | Jeppesen et al. | 714/30 |
| 6,112,298 A | * | 8/2000 | Deao et al. | 712/227 |
| 6,243,842 B1 | * | 6/2001 | Slezak et al. | 714/724 |
| 6,266,801 B1 | * | 7/2001 | Jin | 716/8 |
| 6,324,096 B1 | * | 11/2001 | Tomita | 365/185.05 |
| 6,421,812 B1 | * | 7/2002 | Wang et al. | 716/5 |
| 6,430,719 B1 | * | 8/2002 | Slezak et al. | 714/734 |
| 6,732,311 B1 | * | 5/2004 | Fischer et al. | 714/737 |
| 6,757,844 B1 | * | 6/2004 | Lulla et al. | 714/30 |

OTHER PUBLICATIONS

Narayanan et al., "Reconfigurable Scan Chains: A Novel Approach to Reduce Test Application Time", IEEE, 1993, pp. 710–715.*
Robinson, Gordon D. "Why 1149.1 (JTAG) Really Works", Electro/94 International. Conference Proceedings Combined Volumes, May 10–12, 1994, pp. 749–754.*
"Boundary Scan Descriptive Language for Non–JTAG Components" IBMTDB, Oct. 1993, vol. 36, issue No. 10, pp. 599–600.*
XAPP017 (v3.0), "Boundary–scan in XC4000, Spartan and XC5200 Series Devices", available from Xilinx, Inc., 2100 Logic Drive, San Jose, CA 95124, Nov. 16, 1999, pp 1–17.

* cited by examiner

Primary Examiner—Paul R. Myers
(74) Attorney, Agent, or Firm—Edel M. Young; LeRoy D. Maunu; Lois D. Cartier (57) ABSTRACT

According to the invention, a JTAG-compliant chip is further provided with a controller that receives data provided on the TDI input pin, forms parallel address and data instructions and passes the data through IO pins to the non-JTAG chip without requiring the data to go through the boundary scan register chain of the JTAG-compliant chip. This controller is used to program, erase, and read the other chip. For a non-JTAG flash memory device, the controller in the JTAG-compliant chip generates the necessary programming signal sequences, and applies them to the non-JTAG chip without going through the JTAG boundary scan circuitry.

32 Claims, 8 Drawing Sheets

STRUCTURE AND METHOD FOR WRITING FROM A JTAG DEVICE WITH MICROCONTROLLER TO A NON-JTAG DEVICE

FIELD OF THE INVENTION

The present invention relates to configuration of integrated circuits, particularly using a device with JTAG test circuitry to configure another non-JTAG device.

BACKGROUND

Figure 1:
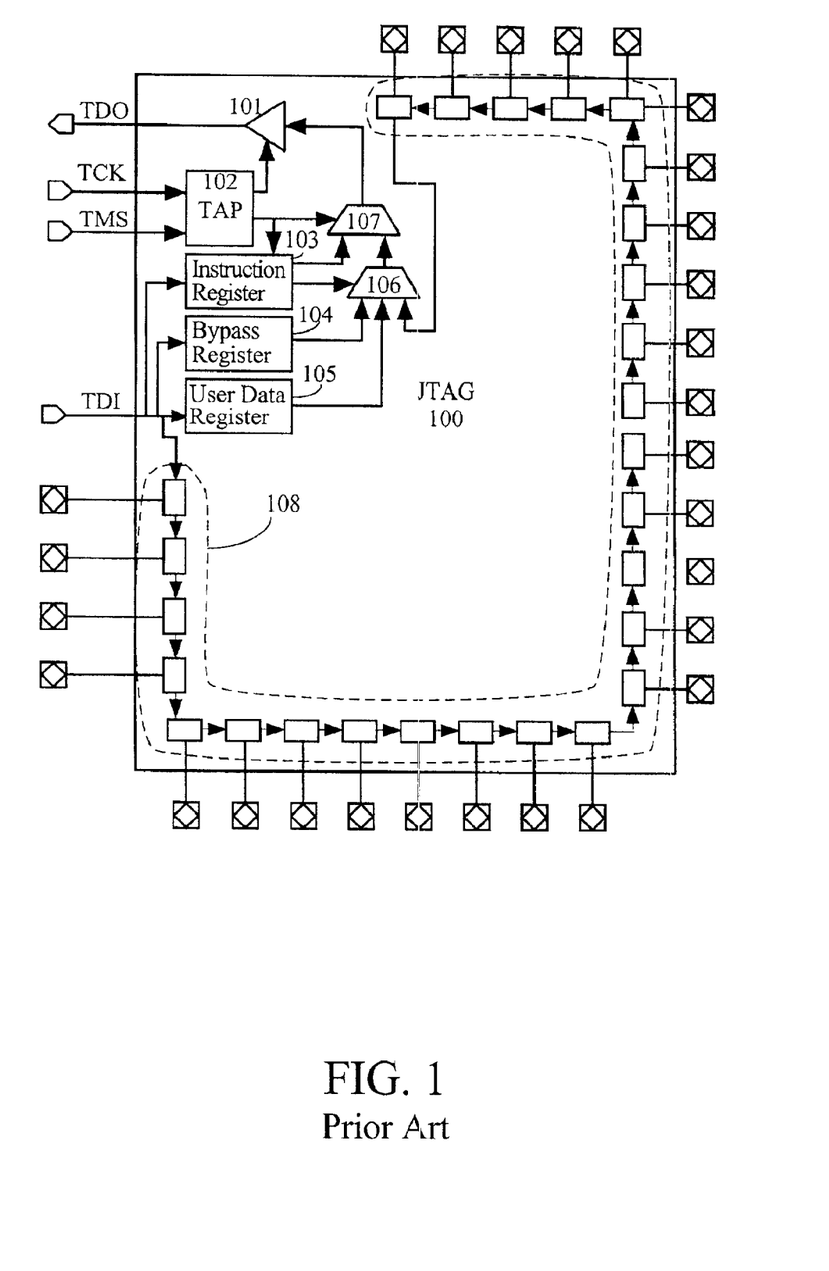
FIG. 1 (prior art) shows a four-wire interface used to control a Test Access Port (TAP) control state machine in every JTAG 1149.1-compliant device.

The IEEE 1149.1 Joint Test Action Group (JTAG) standard defines a serial test methodology that uses serial test circuitry in integrated circuit chips to access test data registers and to control and observe signals between devices on a printed circuit board. As shown in FIG. 1, a four-wire interface consisting of a Test Clock (TCK) pin, a Test Mode Select (TMS) pin, a Test Data Input (TDI) pin, and a Test Data Output (TDO) pin are used to control a Test Access Port (TAP) control state machine 102 in every 1149.1-compliant device. In response to JTAG instructions shifted into the device through the TCK, TMS, and TDI pins, the TAP controller can select between multiple data registers inside the device to shift data into through the TDI pin or from which to bring data out to the TDO pin.

This test methodology allows 1149.1-compliant devices to be serially chained together on a board or across multiple boards. TCK and TMS signals are connected to the TCK and TMS pins of all devices in this chain, while the TDI and TDO pins of each device in this chain are connected in series. Software can access JTAG test data registers on any device in the chain, and can also check or set the state of any pin on any device in this chain by serially shifting in data on the TDI pin of a first device under control of TCK and TMS, and monitoring the serial data output TDO pin of a last device. The standard was originally developed to simplify board interconnect testing by enabling easy access to any pin on a device, especially on the higher-pin count and finer-pitch devices. Connections can be tested by driving known values on one or more pins of one or more JTAG devices, and then confirming that expected values are detected on one or more pins of one or more JTAG devices.

Figure 2:
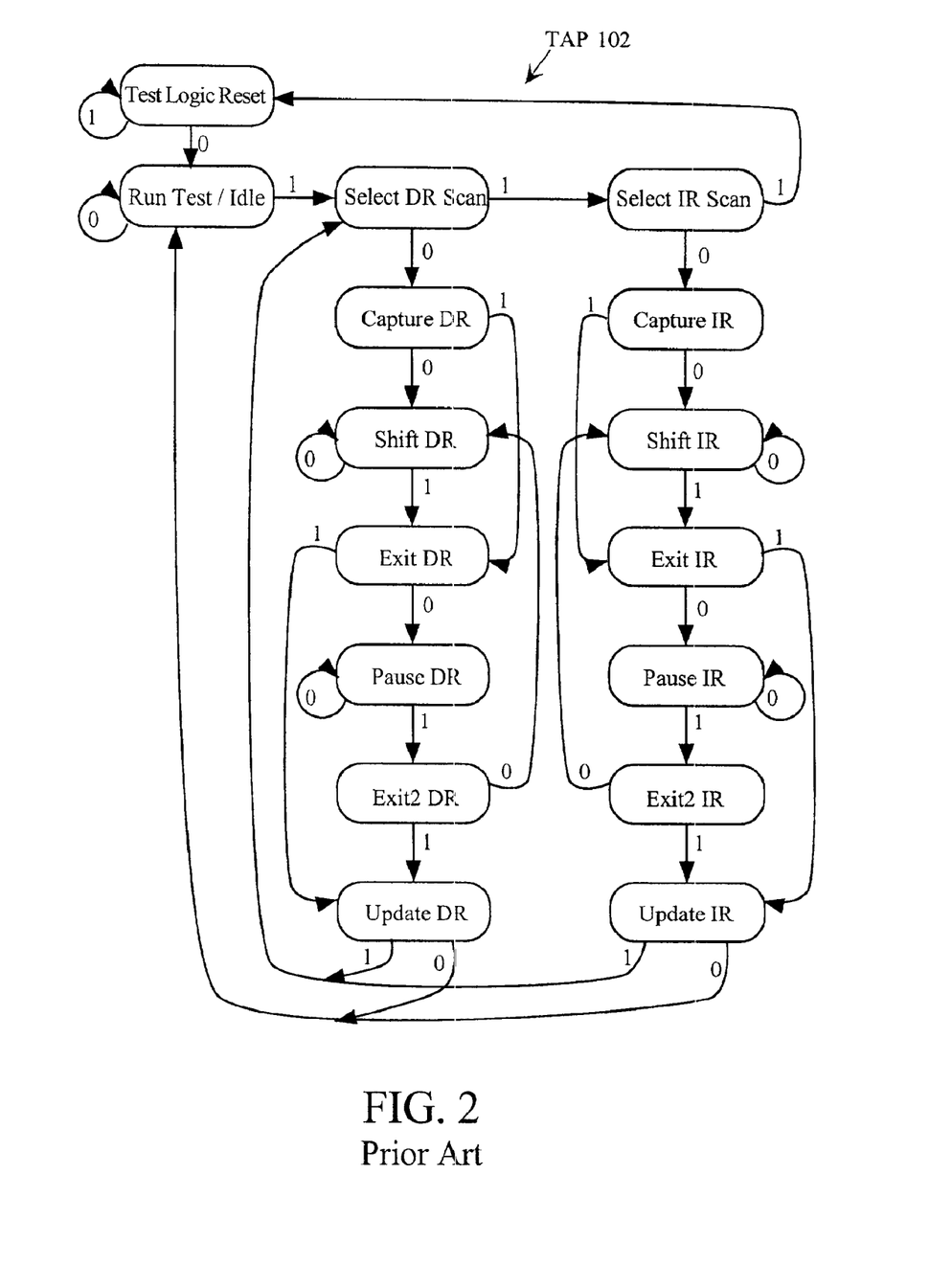
FIG. 2 shows the state machine implemented by the TAP controller of a JTAG 1149.1-compliant device.

FIG. 2 shows the state machine implemented by the TAP controller 102 of a 1149.1-compliant device. Test Access port controller 102 is controlled by the test clock TCK and TEST mode select TMS inputs. These two inputs determine whether an instruction register (IR) scan or a data register (DR) scan is performed. TAP controller 102 is driven by the TCK signal, which responds to the states of the TMS signal as shown in FIG. 2.

Figure 3:
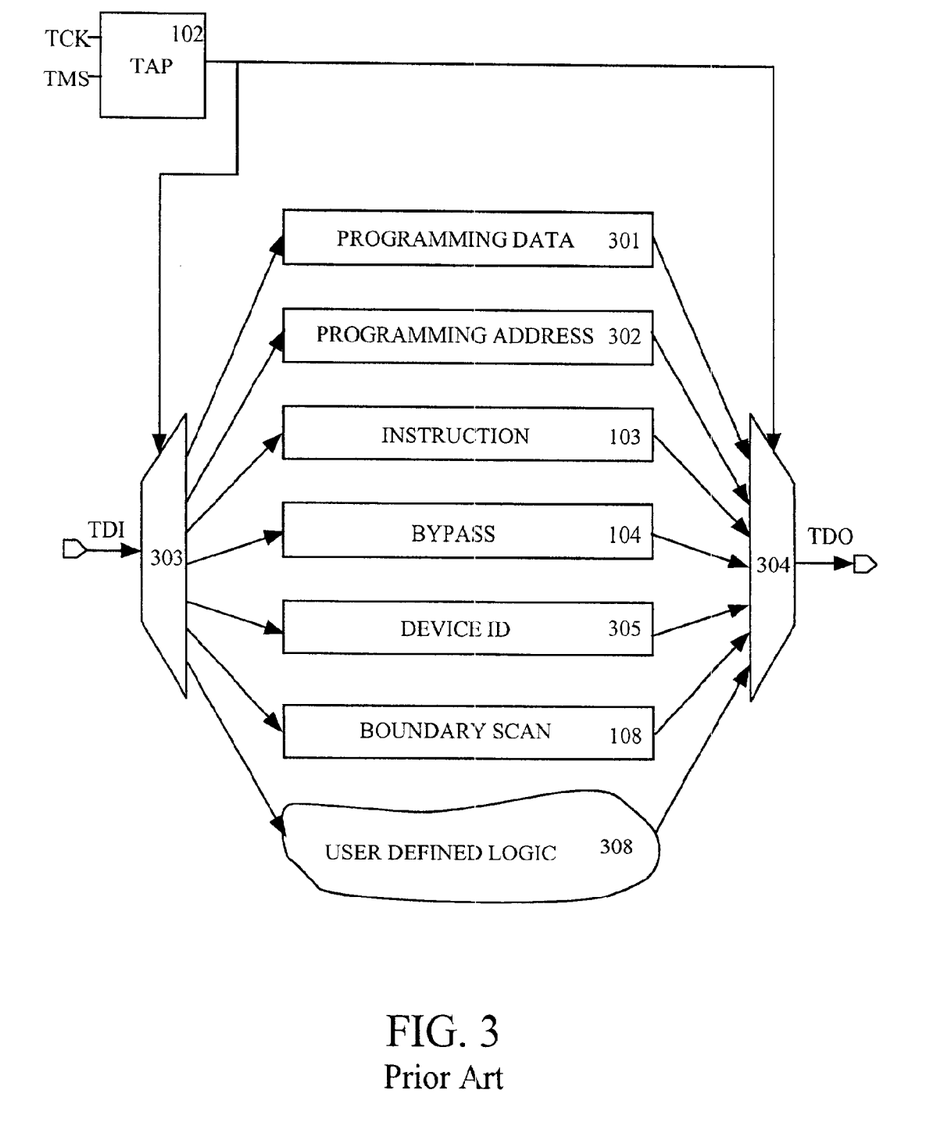
FIG. 3 shows a simplified circuit diagram of a 1149.1-compliant circuit controlled by the TAP controller of FIG. 2.

FIG. 3 shows a simplified circuit diagram of a 1149.1-compliant circuit controlled by TAP controller 102. Data on the TDI pin are routed by de-multiplexer 303 to one of several destinations under control of TAP controller 102. These include the boundary scan structure 108, instruction register 103, a bypass register 104, and a user data register 105 illustrated in FIG. 1. The structure of FIG. 3 shows additional registers 301, 302, and 305 provided in some Xilinx, Inc. FPGA devices for configuring and identifying the FPGA. Multiplexer 304, also under control of TAP controller 102 shifts data out to the TDO pin.

Figure 4:
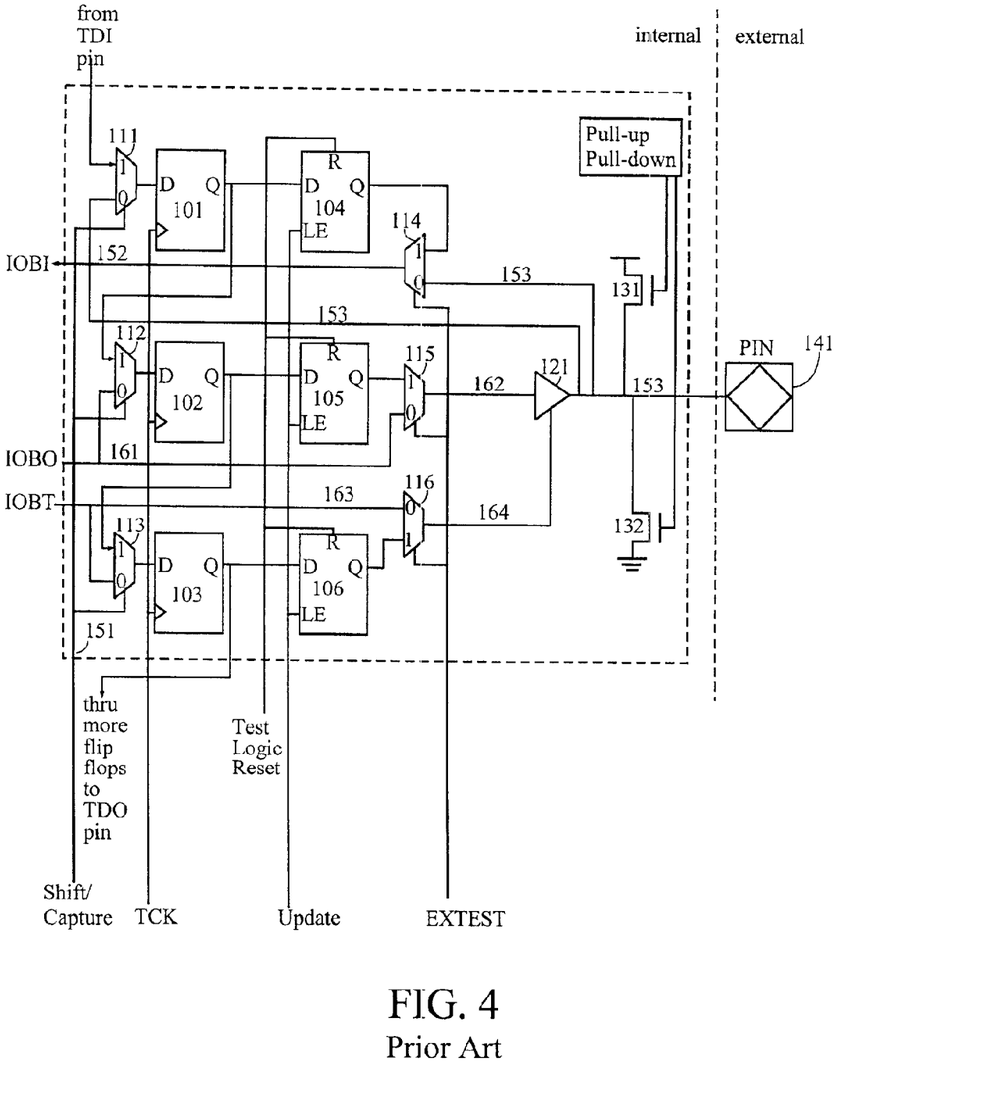
FIG. 4 shows an input/output block with JTAG compliant boundary scan circuitry.

FIG. 4 shows circuitry for implementing boundary scan logic in a typical input/output block (IOB) of a Xilinx Inc. chip. The illustration of FIG. 4 shows a single pin 441 and the input/output buffer (IOB) and boundary scan test data register circuitry 400 associated with that pin. The IOBI (IOB input) line is an input into the IOB, IOBO (IOB output) is the output from the IOB, and IOBT (IOB tristate control) is the control signal generated to control the IOB buffer. In the chip there are many such pins with associated IOBs and boundary scan circuits. This boundary scan chain is selected by the TAP controller to be connected between TDI and TDO when a JTAG test instruction that uses the aforementioned scan chain is loaded.

Three flip flops 401, 402, and 403 may be serially connected by multiplexers 411, 412, and 413 into a shift register. These flip flops may also store and provide input and output signals to and from the interior of the chip during JTAG test operations. These flip flops form part of the boundary scan chain and are connected serially by placing a logic 1 onto the Shift/Capture line. These flip flops capture the input and output states of the IOB when a logic 0 is placed on the Shift/Capture line. Update latches 404, 405, 406 accompany flip flops 401, 402, 403 and are used to hold input test data stable during shifting of data through the boundary scan chain. A buffer 421 drives output signals from line 462 onto pin 441 as controlled by a tristate signal on line 464.

The operation of circuitry 400 is controlled by TCK and control signals from the TAP: Shift/Capture, Update, and EXTEST. When shift/capture line 451 is at logic 1, the boundary scan shift register is enabled and data can be shifted into or out of the boundary scan registers. In a typical operation, data bits are applied to the TDI pin and shifted through the boundary scan chain under control of the TAP controller. Proper operation of the shift register can be observed by pulsing high the Update signal to capture the boundary scan data from flip flops 401 to 403 into latches 404 to 406, then asserting high the EXTEST signal to apply the test data in latch 405 to pin 441. For example if a stream of data applied to the TDI pin includes a logic 1 that arrives at flip flop 403 followed by a selected value (1 or 0) that arrives at flip flop 402, a high Update pulse moves this logic 1 and the selected value to latches 406 and 405. A logic 1 EXTEST value causes multiplexers 416 and 415 to apply the values in latches 406 and 405 to buffer 421. The logic 1 in latch 406 turns on buffer 421 so that the value in latch 405 is applied to pin 441 for external observation. The value shifted into register 401 and updated into latch 404 will be sent to the interior of the chip as signal IOBI through multiplexer 414.

When the EXTEST line is held at logic 0, normal I/O operation is selected. Multiplexer 414 forwards the signal on pin 441 to the interior of the chip as signal IO3I. Also, an input signal on pin 441 is forwarded by multiplexer 411 to flip flop 401 for capture on the next TCK and UPDATE. The IOBO value on line 461 will go to output buffer 421, and will be driven onto pin 441 if the buffer 421 is turned on by the IOBT value on line 463.

To avoid letting line 453 and pin 441 float when no active signal is on line 453, one of weak transistors 431 and 432 is turned on, to pull line 453 high or low (as controlled by the pull-up/pull-down block).

Prior Uses of Boundary Scan Circuits

In addition to board testing, some integrated circuit manufacturers use this four-wire interface to send programming instructions and data to configure programmable logic devices in-system.

One way to configure programmable logic devices is to incorporate programming registers and control logic into a JTAG 1149.1-compliant programmable chip. Such a chip can be configured by serially loading programming address and/or data into one or more of the programming registers through the TAP interface, and then loading a program instruction through the same interface to instruct the chip to perform the programming operation. A controller in the JTAG 1149.1-compliant chip will generate the necessary control signal sequences to configure its programmable cells with the loaded data.

If a programmable chip does not have JTAG circuitry, then programming data and instructions can be sent to it by connecting the programming data and control lines of the non-JTAG device to a JTAG device.

Figure 5:
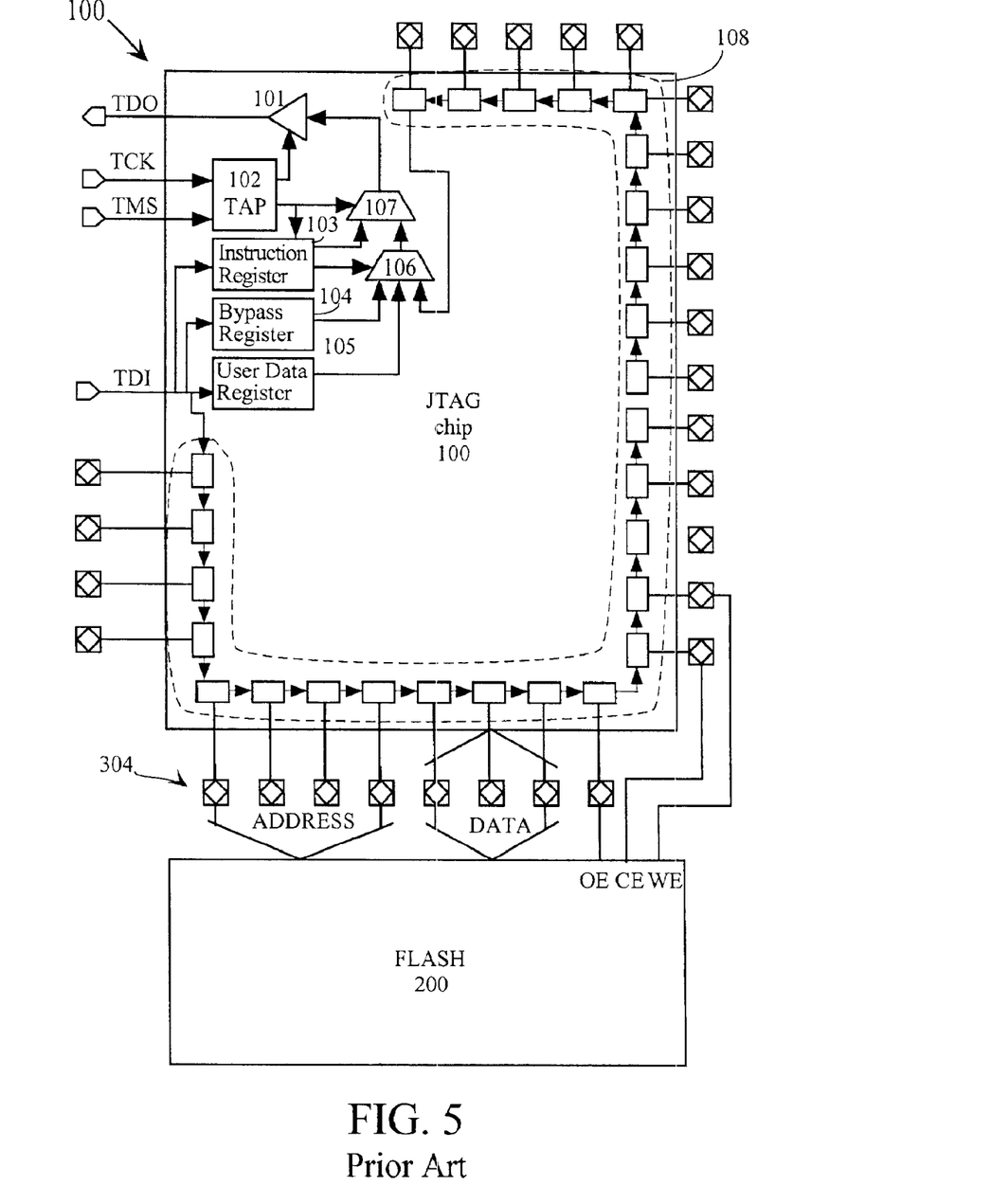
FIG. 5 shows a prior art structure for using the boundary scan circuitry to program another chip.

FIG. 5 shows a JTAG-compliant chip 100 with boundary scan being used to program a flash memory chip 200. IO pins of the JTAG chip 100 are connected to the address, data, and control lines of the flash chip 200. Programming address, data, and control signals for the flash chip 200 are serially shifted into the boundary scan register chain of the JTAG chip 100 until the required values are loaded into the boundary scan registers controlling the appropriate IO pin of the JTAG chip 100. The address, data, and control signals in the boundary scan registers are then driven out to the IO pins of the JTAG chip 100 using a standard EXTEST JTAG instruction. To generate a data programming sequence for a flash memory from a JTAG chip using this method requires multiple boundary scan register load and EXTEST operations.

For example: flash memory chip 200 requires a pulse on its write enable pin WE while its data and address pins are driven with values specifying the data value to write and the memory location to write to. The boundary scan register of the JTAG chip must be serially loaded with values to drive the data pins to the required data value, the address to the specified location, and the write enable line to the inactive state. An EXTEST instruction is then loaded into the JTAG chip 100 to drive these address, data, and (inactive) write enable values to the IO pins connected to the flash chip 200. The boundary scan register is then serially loaded with values to drive the same address and data values, but now the boundary scan cells for the write enable pin must be loaded with the appropriate bits to drive the write enable signal to an active state. Another EXTEST instruction drives these values to the IO pins. During these two operations, the address and data lines will retain the same values, but the write enable pin will now be switched from inactive to active. For a third time, the boundary scan register chain is serially loaded with bits to hold the same address and data values, and the write enable boundary scan cells are loaded with values to set the write enable pin back to the inactive state. Another EXTEST instruction will drive the same address and data values onto the IO pins, and the write enable pin will now be driven back to the inactive state to complete the write operation for this memory location. The time required to perform a write operation will depend on the length of the boundary scan register chain. JTAG chips with more pins will have longer boundary scan chains.

A read operation is performed similarly: the read address is serially loaded and then driven to the IO pins of the JTAG device using EXTEST. A standard JTAG SAMPLE instruction is executed on the JTAG chip to sample the flash chip data lines connected to the IO pins of the JTAG chip by loading them into the input boundary scan cells. These sampled data values are then shifted out through TDO to a JTAG test system for processing.

It is desirable to continue using a JTAG chip for configuring a non-JTAG chip, but to increase the speed with which data can be shifted into position to be transferred to or from the other non-JTAG chip 200 (such as a flash memory chip).

SUMMARY OF THE INVENTION

According to the invention, a JTAG-compliant chip is further provided with a controller that receives data provided on the TDI input pin, forms parallel address and data instructions and passes the data through IO pins to the non-JTAG chip without requiring the data go through the boundary scan register chain. This controller is used to program, erase, and read the other chip. For a flash memory device, the controller in the JTAG-compliant chip generates the necessary programming signal sequences, and applies them to the other chip without going through the JTAG boundary scan circuitry.

DETAILED DESCRIPTION

Figure 6:
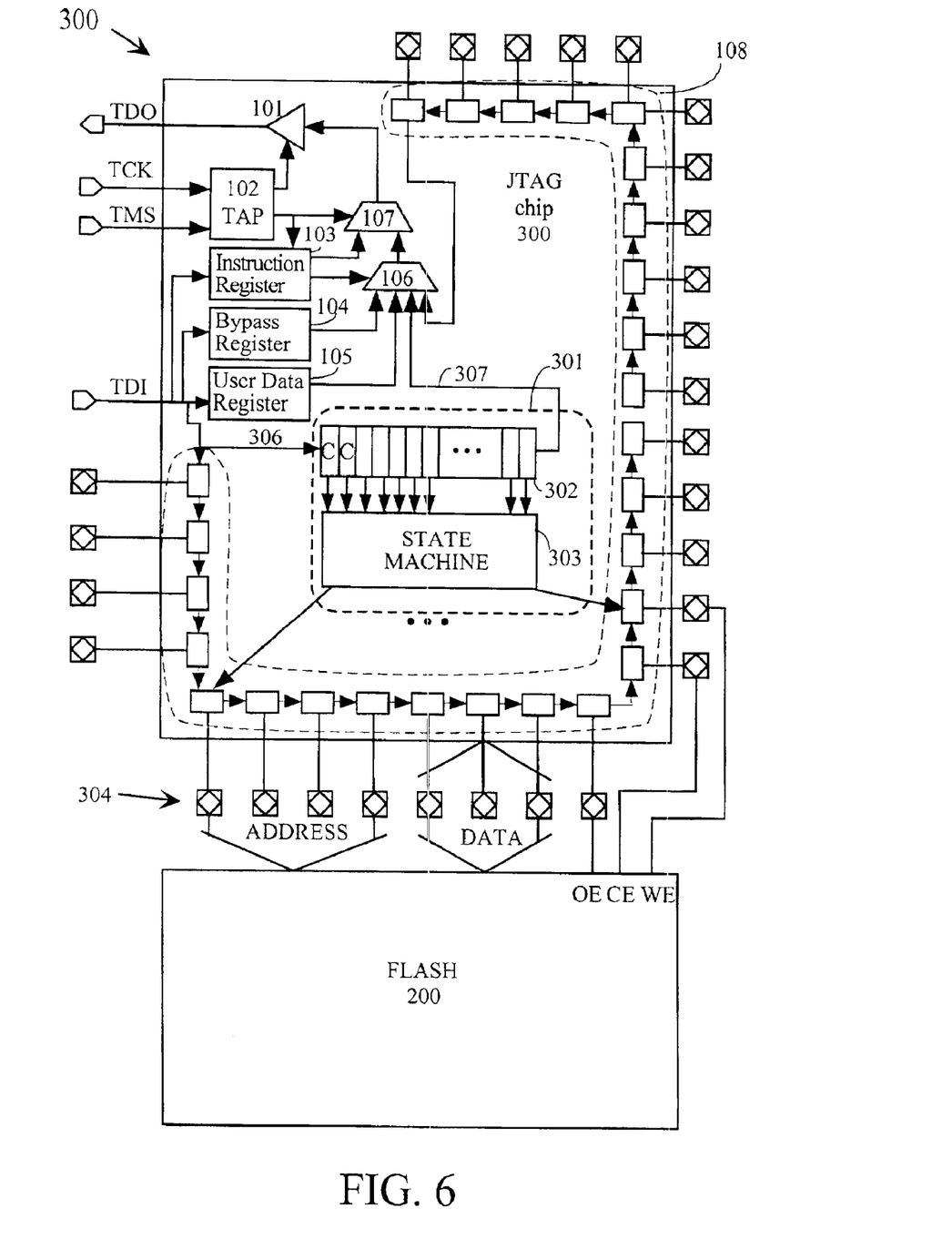
FIG. 6 shows a structure according to the invention for using a JTAG device to program another chip.
Figure 7:
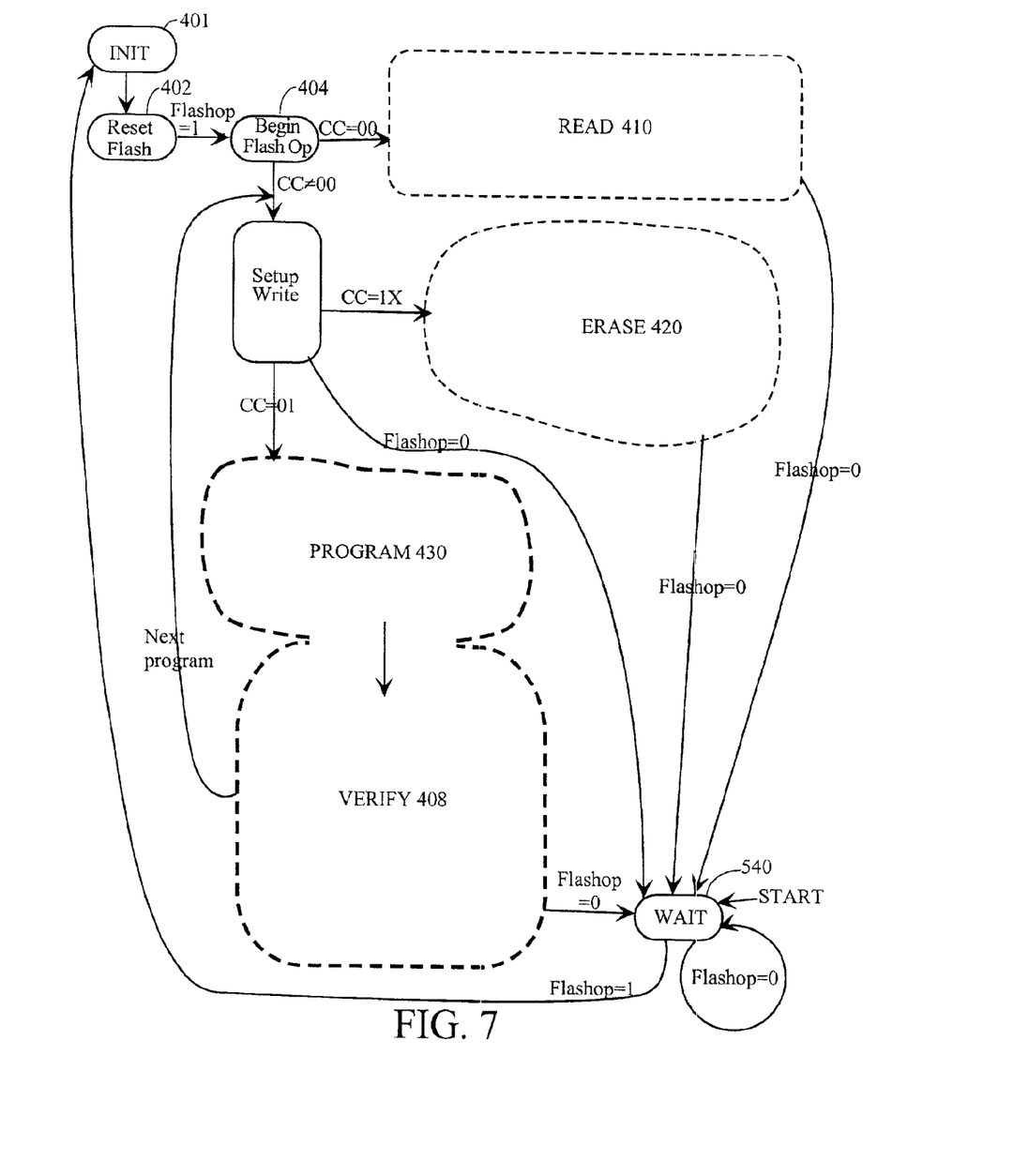
FIG. 7 shows a state machine for reading, erasing, and programming a non-JTAG compliant chip.

FIG. 6 shows an embodiment of the invention in which a JTAG-compliant chip 300 is used for receiving input data at a JTAG input port TDI, processing that input data, and programming, erasing, and reading a non-JTAG compatible flash memory device 200. The boundary scan structure of chip 300 is bypassed by controller 301. Controller 301 responds to commands and data on the TDI input and directly generates signals for reading, erasing, and programming flash memory 200. Controller 301 includes a shift register 302 for collecting a command, an address, and data shifted in on the TDI input port. The controller 301 also includes a state machine 303 for processing the information in shift register 302 and providing and receiving signals to and from pins 304. In one embodiment, chip 300 is a Xilinx Virtex FPGA and flash memory 200 is an AMD flash memory device. The Virtex chip has a path 306 from the TDI pin into the Virtex core logic. This path can be used by the core logic when any of two JTAG USER instructions is loaded into instruction register 103. In one embodiment, the second (USER2) instruction is used. This USER2 instruction enables this TDI path 306, and also causes an internal Virtex signal SEL2 to become active to indicate that a user-defined JTAG operation is active. The shift register 302 is created from Virtex core logic to hold the commands and address/data. When the JTAG USER2 instruction is loaded into instruction register 103, shift register 302 takes TDI as input, is clocked by TCK, and the output of this shift register 302 is connected to TDO (see FIG. 3).

The JTAG-compliant TAP controller in a Virtex device generates SHIFT and UPDATE signals that are accessible by the Virtex core logic to indicate when TDI data is being shifted into the shift register and when the shift register has been updated with a value ready for processing by the controller.

For this AMD flash memory device 200, shift register 302 is 24 bits long. The length and data format of shift register 302 and state machine 303 are selected to meet requirements of flash memory chip 200. If another type of non-JTAG chip is to be accessed, controller 301 is modified accordingly. In the present embodiment, the two most significant bits CC in shift register 302 are command bits. Two bits can distinguish between four commands, in the present example "read", "erase chip", "erase sector" and "program". The remaining 22 bits are used to represent address or data information depending on the state of state machine 303. The state machine in this embodiment may be clocked by a separate system clock SYSCLK, enabling it to operate at a higher frequency than JTAG TCK. Alternatively, state machine 303 may be clocked by TCK.

Figure 8:
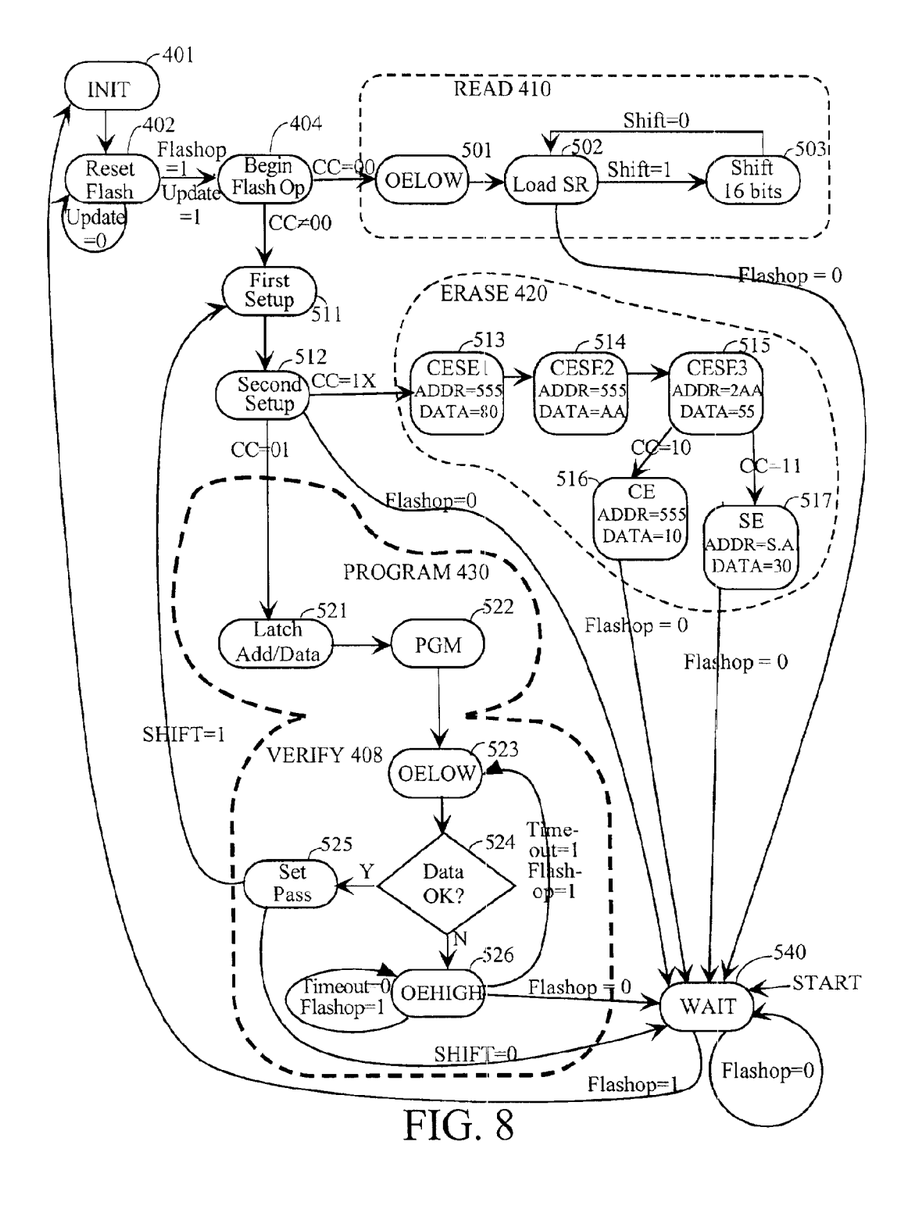
FIG. 8 shows one embodiment of the state machine of FIG. 7.

FIG. 8 shows a representation of state machine 303. State machine 303 monitors the SEL2 signal and uses this signal as a FLASHOP signal to indicate that a flash operation will be performed on flash chip 200. The state machine 303 remains in WAIT state 540 while FLASHOP=0. When FLASHOP=1, then state machine 303 goes to the INIT state 401 where it begins initializing controller registers. In this embodiment, the state machine checks the FLASHOP signal at different safe states to determine if it is still in the flash operation state. If FLASHOP=0, then this means another JTAG instruction was loaded and the flash operation should stop. A safe state is one where the flash chip 200 is in a stable state and can be left in this state when the state machine 303 goes to the WAIT state 540.

The state machine moves from INIT state 401 to state 402 on the next SYSCLK cycle, which instructs the controller 301 to generate flash chip reset signals. Concurrently, a command and a starting flash operation address are being shifted into the 24-bit register. These operations can be concurrent since TCK and SYSCLK can operate independently in this embodiment. The state machine waits in state 402 until it detects UPDATE=1 at which point it stores the upper 2 bits CC in a two-bit opcode register and the lower 22 bits into a holding register. The controller then moves to state 404 where it decodes the two bit command in the opcode register and copies the 22-bit holding register value into an address counter. If CC=0, the controller goes to state 410 for a read operation. If CC is not=0, the controller goes to state 511 for program, chip or sector erase operations. When programming or erasing, the state machine goes through 2 setup states 511 and 512 which generate outputs for the first two bus cycles of the AMD flash program or erase command sequence. In state 511 the controller drives the flash memory address lines to the 12-bit hex value 555 and the 8 memory data lines to the 8-bit hex value AA. In state 512, the controller drives the flash address lines to hex 2AA and the flash data lines to hex 55.

Read

A READ operation is performed until FLASHOP goes low. Looking at READ state 410 in more detail, in state 501, state machine 303 sends an output enable signal to flash memory 200, and drives the address counter value loaded in state 404 to the IO pins connected to the flash address lines. The controller waits the required flash memory access time by decrementing a delay counter, then moves to state. 502, at which time the 16 bits of addressed data in flash memory 200 are loaded into shift register 302. The other 8 bits of the 24-bit shift register 302 are loaded with 0's in one embodiment, but can be loaded with status or other information in another embodiment. A high SHIFT signal from the TAP (in response to an external JTAG test system) moves state machine 303 to state 503 where the 24 shift register bits are shifted out to the TDO pin for external observation. Note that the Virtex JTAG device can be part of a multi-chip JTAG chain, in which case the SHIFT signal may be active for more than 24 TCK cycles. The TDO data of the Virtex JTAG device may feed the TDI of another JTAG device and the JTAG test system will have to be in the SHIFT-DR state (see FIG. 2) for as many TCK cycles as required to clock the 24-bits through the test data registers of the JTAG chips in the chain ahead of the Virtex JTAG chip. When SHIFT goes low, the shift register bits have been shifted out, the address counter loaded in state 501 is incremented to the next memory address, and state machine 303 returns to state 502. In state 502, if FLASHOP is still high, then the state machine reads the next memory location and waits for the SHIFT signal to shift the new data to TDO. If FLASHOP is low, state machine 303 moves to WAIT state 540, and the READ operation is complete.

Erase

When beginning the operation in state 512, if an erase command (chip erase or sector erase) is loaded into shift register 302, state machine 303 reads this command and moves to erase state 420. In the example where flash memory 200 is an AMD flash memory device, a chip or sector erase operation requires 6 bus cycles. The first 2 bus cycles are performed in states 511 and 512. The third bus cycle is performed on the next SYSCLK, where the controller moves to state 513 and drives the flash address lines to hex 555 and 8 data lines to hex 80. The next SYSCLK moves the state machine to state 514 which in turn causes the controller to perform the fourth bus cycle. The controller holds the address line values but changes the data values to hex AA. The fifth bus cycle is performed on the next SYSCLK where the controller moves to state 515 and drives the address lines to hex 2AA and data lines to hex 55. The state machine checks the 2-bit command to determine if a chip erase (CC=10) or sector erase (CC=11) is to be performed. The sixth bus cycle for a chip erase command has the controller driving the address lines to hex value 555 and data lines to hex 10 when the state machine moves to state 516. If a sector erase is specified, then the controller moves to state 517 and drives the 22-bit value from the address register loaded in state 404 (which is the flash sector to be erased) to the address pins, and drives the data lines to hex 30. For either operation, the controller waits in state 516 or 517 until the external JTAG test system loads a non-USER instruction. The non-USER instruction causes the FLASHOP signal to go low, which the test system will do after waiting the required amount of time for the AMD flash device to perform a chip or sector erase operation. When FLASHOP=0, the chip or sector erase operation is complete and the state machine moves to the WAIT state 540.

Program

When state machine 303 is in state 512, if state machine 303 detects a PROGRAM command in the opcode register loaded in state 402, PROGRAM state 430 is entered. The AMD flash device has a 4 bus-cycle program sequence for programming a 16-bit word. The first 2 bus cycles were performed in states 511 and 512, similar to the first 2 bus cycles of the erase operation. The memory address to program a 16-bit word was specified in state 402 and loaded into an address counter. The state machine waits in state 512 for the JTAG test system to shift in 24 bits containing the 16-bit word to program into flash device 200. The state machine waits in state 512 until UPDATE=1, and then stores the rightmost 16 bits of the 24-bit shift register into a 16-bit PROGDATA register before moving to state 521. In state 521, the third bus cycle in a program operation causes controller 301 to drive the 12-bit address line to hex value 555 and the 8 data lines to hex value A0 for one SYSCLK cycle. The fourth bus cycle occurs on the next SYSCLK cycle, where the controller stays in state 521, drives the flash memory address stored in state 404, drives the data lines with the PROGDATA register value, and drives the flash write-enable pin low. Controller 301 then waits in state 521 for a flash data access length of time (which is dependent on the flash memory), drives the write enable pin high to latch the address and data into the flash (which also starts the internal AMD flash programming state machine inside flash device 200), and increments the address counter in preparation for the next PROGRAM operation before moving to state 522. In state 522, controller 301 holds the flash address and data lines at the specified values for the flash data access length of time before driving the flash device 200 output enable pin low. The controller then moves to state 523 to check the status of this 16-bit-word programming operation. The controller does this by holding the flash output enable pin active low while comparing the data lines to the PROGDATA value (decision box 524). If they are not equal, then the state machine goes to state 526 which drives the flash output enable pin to an inactive high while waiting for a timer to count the flash data access length of time before going back to state 523. The controller continues this loop until one of two conditions occur: the data comparison is successful, or the external JTAG test system starts loading the next 16 bits of data to be programmed into flash device 200. If the data comparison is successful, then the internal AMD flash programming state machine has programmed the 16-bit data into the specified address location. The state machine 303 moves to state 525 where the controller sets internal status registers and waits for SHIFT to go high to indicate the beginning of the next 16-bit programming data shift sequence. If the data comparison was not successful and SHIFT=1, then this indicates that the external JTAG system has begun shifting in the next 16 bits of data to program. This can occur in either state 523 or 524. In either state, controller 301 will set a program-fail bit if an internal status register before going to state 511.

To program a consecutive word location into flash memory 200, the external JTAG system serially shifts in a 24-bit value containing the 16-bit word to program, and the controller goes through the 4 bus cycle program command sequence again by going to states 511, 512, 521, and 522. The flash memory location in the address counter has already been incremented in the previous transition through state 521, so it is not necessary for the external JTAG test system to load an address.

To program non-consecutive memory locations, in this embodiment, requires that the JTAG test system shift in the address, followed by the word to program, and then a non-USER JTAG instruction to force the controller to go to the WAIT state. The JTAG test system must then reload the USER instruction to reactivate FLASHOP before loading the non-consecutive flash memory address and data word to program. In an alternative embodiment, a JTAG device accepts multiple USER instructions, allowing multiple shift registers to be defined. Programming non-consecutive flash memory locations is then accomplished by creating in the JTAG device separately loadable address and data word shift registers.

Other embodiments of the invention are also contemplated. For example, while the above description is of an embodiment implemented in a JTAG 1149.1-compliant device, another embodiment is implemented in a JTAG 1532-compliant device, but does not use any of the instructions specific to the JTAG 1532 standard.

What is claimed is:

1. A JTAG-compliant chip for communicating with a non-JTAG-compliant chip comprising:
   a JTAG-compliant test access port (TAP) controller integrated on a programmable logic device (PLD);
   a TAP input pin coupled to the TAP controller on the PLD;
   a boundary scan shift resister coupled to the TAP input in and to the TAP controller;
   a plurality of pins of the PLD coupled to the first shift resister and coupled to the non-JTAG-compliant chip; and
   a controller implemented on programmable logic resources of the PLD coupled to:
   receive signals from a second shift register that is coupled to the TAP input pin and implemented on programmable logic resources of the PLD, and
   in response to the signals from the shift register and the TAP controller, send and receive signals on the plurality of PLD pins coupled to the non-JTAG-compliant chip.

2. The JTAG-compliant chip of claim 1 wherein the TAP controller accesses external TDI and TDO control signals.

3. The JTAG-compliant chip of claim 2 wherein the TAP controller allows the controller to access the external TDI and TDO control signals.

4. The JTAG-compliant chip of claim 1 wherein the controller comprises
   a state machine that in response to commands in the shift register sends and receives signals on the plurality of PLD pins.

5. The JTAG-compliant chip of claim 1 wherein the controller uses the signals on the plurality of PLD pins to write to and read from the non-JTAG-compliant chip.

6. The JTAG-compliant chip of claim 5 wherein the non-JTAG-compliant chip is a flash memory chip and the controller further uses the signals on the plurality of PLD pins to erase the flash memory chip.

7. The JTAG-compliant chip of claim 1 wherein the programmable logic device is a field programmable gate array chip.

8. A method of using a programmable logic device having a boundary scan structure to access a chip not having a boundary scan structure comprising:
   programming the programmable logic device having the boundary scan structure to implement a shift register and a controller for;
   receiving boundary scan input signals,
   providing boundary scan output signals,
   providing signals to the chip not having a boundary scan structure, and
   receiving signals from the chip not having a boundary scan structure.

9. The method of claim 8 wherein the step of providing signals to the chip not having a boundary scan structure comprises providing commands to indicate one of a plurality of operations to be performed.

10. The method of claim 9 wherein the step of providing signals to the chip not having a boundary scan structure further comprises providing an address to the chip not having a boundary scan structure.

11. The method of claim 10 wherein the step of providing signals to the chip not having a boundary scan structure further comprises providing data to the chip not having a boundary scan structure.

12. The method of claim 8 wherein the step of receiving signals from the chip not having a boundary scan structure comprises receiving data from the chip not having a boundary scan structure addressed by some of the signals provided in the step of providing signals to the chip not having a boundary scan structure.

13. A method of configuring a non-JTAG chip from a JTAG-compliant programmable logic device (PLD) having programmable logic resources, the method comprising the steps of:
   a. loading an instruction into a JTAG TAP interface of the PLD that causes the JTAG TAP interface to enable a path for serial data transfer from a JTAG-compliant TDI pin to the programmable logic resources of the PLD;
   b. defining a shift register in the programmable logic resources of the PLD that receives data transferred from the TDI pin; and
   c. defining a controller in programmable logic resources of the PLD that receives the shift register data in parallel with the JTAG TAP interface and generates from this data signals applied to pins of the PLD that are coupled to pins of the non-JTAG chip.

14. The method of claim 13 wherein the shift register defined in the programmable logic resources of the JTAG-compliant chip outputs data to a JTAG-compliant TDO pin.

15. The method of claim 13 comprising the additional step performed by the controller of receiving signals from the non-JTAG chip.

16. The method of claim 13 wherein the shift register comprises two shift registers, one of which receives address data for addressing part of the non-JTAG chip and another of which receives data words for being loaded into the non-JTAG chip.

17. The method of claim 13 wherein the shift register receives both address data for addressing part of the non-JTAG chip and data words for being loaded into the non-JTAG chip.

18. The method of claim 17 wherein the address data is loaded into the shift register first, and becomes a starting address for subsequent data words to be loaded into the non-JTAG chip, and is incremented internally by the controller for loading a plurality of the data words.

19. The method of claim 17 wherein the address data, data word, and any other data needed by the non-JTAG chip are applied in parallel to the non-JTAG chip.

20. The method of claim 19 wherein the address data, data word, and any other data needed by the non-JTAG chip configure part of the non-JTAG chip.

21. A programmable logic device (PLD), comprising:
   a plurality of programmable logic, input/output, and routing resources;
   a plurality of input/output pins coupled to the plurality of programmable input/output resources;
   a test data input (TDI) pin;
   a scan register coupled to the TDI pin;
   an instruction register coupled to the TDI pin;
   a boundary scan controller coupled to the TDI pin, the scan register, and the instruction register, the boundary scan controller adapted to activate a first signal in response to a first instruction code in the instruction register;
   a shift register implemented in programmable logic resources of the PLD, coupled to the TDI pin, and coupled to a subset of the input/output pins; and
   a control circuit implemented in programmable logic resources of the PLD and coupled to the shift register and to the subset of input/output pins, the control circuit adapted to enable shifting of data from the TDI pin to the shift register responsive to activation of the first signal, and perform one of a read operation and a write operation on the subset of input/output pins responsive to a state of at least one of the bits in the shift register.

22. The PLD of claim 21, wherein the control circuit is further adapted to read data from the subset of input/output pins and store the data in the shift register responsive to a first state of the at least one control bit in the shift register.

23. The PLD of claim 22, wherein the control circuit is further adapted to write data from the shift register to the subset of input/output pins responsive to a second state of the at least one control bit in the shift register.

24. The PLD of claim 23, wherein the instruction code is a code reserved for signaling a non-boundary-scan circuit from a boundary scan controller.

25. The PLD of claim 23, wherein the at least one control bit in the shift register includes at least two control bits, and the control circuit is further adapted to generate signals at the subset of input/output pins for erasing data on a memory chip coupled to the PLD in response to a third state of the at least two control bits.

26. The PLD of claim 25, wherein the control circuit is further adapted to generate signals at the subset of input/output pins for erasing data from a subset of addressable memory on the memory chip in response to a fourth state of the at least two control bits.

27. A method for accessing a non-boundary scannable memory via a programmable logic device (PLD), comprising:
   implementing a control circuit and a shift register coupled to the control circuit on programmable logic, input/output, and routing resources of the PLD;
   coupling the shift register to a test data input (TDI) pin of the PLD, and coupling the control circuit to a boundary scan controller of the PLD with programmable routing resources of the PLD;
   coupling the shift register to a subset of input/output pins of the PLD with routing resources of the PLD;
   activating a first signal by the boundary scan controller in response to a first instruction code in a boundary scan instruction code register;
   enabling shifting of data from the TDI pin to the shift register by the control circuit in response to the activated first signal; and
   generating access signals at the subset of input/output pins by the control circuit in response to a state of at least one control bit in the shift register.

28. The method of claim 27, further comprising reading data at the subset of input/output pins and storing the data in the shift register by the control circuit in response to a first state of the at least one control bit in the shift register.

29. The method of claim 28, further comprising writing data from the shift register to the subset of input/output pins by the control circuit in response to a second state of the at least one control bit in the shift register.

30. The method of claim 29, wherein the at least one control bit in the shift register includes at least two control bits, the method further comprising generating signals at the subset of input/output pins for erasing data on a memory chip coupled to the PLD by the control circuit in response to a third state of the at least two control bits.

31. The method of claim 30, further comprising generating signals at the subset of input/output pins for erasing a subset addressable memory of the memory chip by the control circuit in response to a fourth state of the at least two control bits.

32. The method of claim 27, wherein the instruction code is a code reserved for signaling a non-boundary-scan circuit from a boundary scan controller.

* * * * *